(12) United States Patent
Seki et al.

(10) Patent No.: US 8,134,409 B2
(45) Date of Patent: Mar. 13, 2012

(54) RADIO FREQUENCY POWER AMPLIFIER

(75) Inventors: Masato Seki, Osaka (JP); Masahiro Maeda, Osaka (JP); Masatosi Kamitani, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/823,474

(22) Filed: Jun. 25, 2010

(65) Prior Publication Data

US 2011/0001566 A1    Jan. 6, 2011

(30) Foreign Application Priority Data

Jul. 2, 2009    (JP) ................. 2009-158265

(51) Int. Cl.
*H03F 3/68*    (2006.01)
(52) U.S. Cl. ............ 330/295; 330/124 R; 330/302
(58) Field of Classification Search .......... 330/302, 330/295, 124 R, 51, 84, 286
See application file for complete search history.

(56) References Cited

U.S. PATENT DOCUMENTS

| | | | |
|---|---|---|---|
| 7,030,691 B2 | 4/2006 | Kim | |
| 7,248,111 B1 | 7/2007 | Xu et al. | |
| 2007/0222523 A1* | 9/2007 | Arell | 330/302 |
| 2008/0111630 A1 | 5/2008 | Harima | |

OTHER PUBLICATIONS

U.S. Appl. No. 12/823,415 to Hirokazu Makihara et al., which was filed Jun. 25, 2010.
U.S. Appl. No. 12/833,536 to Junji Kaido et al., which was filed Jul. 9, 2010.
U.S. Appl. No. 12/859,914 to Satoshi Makioka et al., which was filed Aug. 20, 2010.
U.S. Appl. No. 12/873,538 to Satoshi Makioka et al., which was filed Sep. 1, 2010.

* cited by examiner

*Primary Examiner* — Hieu Nguyen
(74) *Attorney, Agent, or Firm* — Greenblum & Bernstein, P.L.C.

(57) ABSTRACT

A radio frequency power amplifier includes an input terminal to which a radio frequency signal is applied; a first hetero-bipolar transistor (HBT), which amplifies the radio frequency signal; a second HBT, which amplifies the radio frequency signal; a matching circuit connected to an output node of the second HBT; a switch connected to an output node of the matching circuit; and an output matching circuit connected to an output node of the first HBT. The output node of the switch is connected to the output node of the first HBT via the output matching circuit, and an impedance looking into an output side of the radio frequency power amplifier from the output node of the switch is higher than an impedance looking into the output side of the radio frequency power amplifier from the output node of the first HBT.

8 Claims, 8 Drawing Sheets

RADIO FREQUENCY POWER AMPLIFIER

BACKGROUND OF THE INVENTION (1) Field of the Invention

The present invention relates to a radio frequency power amplifier used for transmission in mobile communication such as a mobile phone.

(2) Description of the Related Art

High efficiency (power saving) of transmission power amplifiers which consume a large amount of power as well as the miniaturization of batteries have been important in order to achieve mobile phones which are small, lightweight and are able to perform communication for extended periods of time. The power amplifiers used for the transmissions carried out by the mobile phones are called power amplifier (PA) modules. GaAs radio frequency transistors, which are excellent in radio frequency characteristics and power conversion efficiency, are mainly used as such PA modules. The GaAs radio frequency transistors include field-effect transistors (hereinafter referred to as "FETs") and hetero-bipolar transistors (hereinafter referred to as "HBTs").

In a CDMA scheme, such as Wideband-Code Division Multiple Access (W-CDMA), a method is used in which radio frequency power output from antennas of mobile terminals are adjusted according to the distance to a base station or surrounding environment so that radio frequency power arriving at the base station are approximately equal to each other. Generally, when the distance to the base station is far, radio frequency power output from an antenna is high, and when the distance to the base station is near, the radio frequency power output from the antenna is low. The radio frequency power is output from the antenna through adjustment of the output of the PA module. The output from the antenna is often relatively low; and thus, achieving high efficiency of the PA module in the low output state is extremely important for reducing power consumption.

FIG. 1 is a block diagram of a PA module disclosed in Patent Reference 1 (U.S. Pat. No. 7,248,111). Hereinafter, a conventional PA module is described with reference to FIG. 1. In the following description, like numerals are used for like elements.

As an example, the PA module is designed such that a main circuit operates when the radio frequency output from an output terminal 122 is greater than 15 dBm, and a subcircuit operates when the radio frequency output from the output terminal 122 is equal to or less than 15 dBm.

First, operations of the main circuit are described. The radio frequency power input to an input terminal 121 is input to an earlier stage HBT 101 via an input matching circuit 111. The radio frequency power amplified by the earlier stage HBT 101 is input to a subsequent stage HBT 102 via an inter-stage matching circuit 112. The radio frequency power amplified by the subsequent stage HBT 102 is output from an output terminal 122 via an output matching circuit 113.

Next, operations of the subcircuit are described. The radio frequency power input to the input terminal 121 is input to a sub HBT 103 via an input matching circuit 114. The radio frequency power amplified by the sub HBT 103 is output from the output terminal 122 via a matching circuit 115, a switch 105, and the output matching circuit 113.

However, the conventional PA module in FIG. 1 has a problem in that $Z_A$ at the time of operation of the main circuit and $Z_B$ at the time of operation of the subcircuit cannot be designed independently.

In the block diagram of the conventional PA module in FIG. 1, let the point at a collector terminal side of the subsequent stage HBT 102 be A, the point at an output node side of the switch 105 be B, the point at an input side of the output matching circuit be C, the intersection point of the subcircuit with the main circuit be D, the impedance looking into the point D from the point A be $Z_A$, the impedance looking into the point D from the point B be $Z_B$, and the impedance looking into the output terminal 122 from the point C be $Z_C$. When the main circuit operates, the switch 105 is turned off; and thus, the impedance looking into the point B from the point D is open (high impedance). Further, when the subcircuit operates, the subsequent stage HBT 102 is turned off; and thus, the impedance looking into the point A from the point D is open. Therefore, $Z_A$ at the time of operation of the main circuit and $Z_B$ at the time of operation of the subcircuit each needs to be equal to $Z_C$ to match the output matching circuit 113. As a result, $Z_A$ and $Z_B$ cannot be designed independently.

The following describes a specific example of a disadvantage which can occur. In the configuration of the conventional PA module of FIG. 1, in the operation of the main circuit, adjacent channel leakage power ratio (hereinafter, simply referred to as ACPR) of −40 dBc or less and efficiency of power conversion (hereinafter, simply referred to as efficiency) of 40% or more are required under the conditions of frequency of 1920 MHz, power voltage of 3.5 V, and output power of 28 dBm. In order to meet such characteristics, it is preferable to set $Z_A$ to 4Ω. As a result of evaluation of the PA module shown in FIG. 1 under the load condition, characteristics of ACPR of −42 dBc and efficiency of 42% were obtained in the frequency of 1920 MHz and the output power of 27 dBm.

In the operation of the subcircuit, ACPR of −40 dBc or less and efficiency of 23% or more are required under the conditions of the frequency of 1920 MHz, the power voltage of 3.5 V, and the output power of 16 dBm. In order to meet such characteristics, it is preferable to set, to 50Ω, the impedance Zsub looking into the matching circuit 115 side from the collector terminal of the sub HBT 103. At this time, the switch 105 is in its on state, and the on-resistance is 2Ω. $Z_B$ is 4Ω, being equal to $Z_A$.

FIG. 2 is a graph showing relationship between $Z_B$ and switch loss in the conventional PA module. For example, where the resistance of the switch 105 is 2Ω, loss at the switch 105 is 1.75 dB when Zc is 4Ω. When the resistance of the switch 105 is 2Ω, it is also possible to reduce the loss to 0.8 dB by setting $Z_B$ to 10 Ω.

As shown in FIG. 2, when the on-resistance of the switch 105 is 2Ω, and $Z_B$ is 4Ω, loss of radio frequency power at the switch 105 is 1.75 dB. As a result of the evaluation of the subcircuit shown in FIG. 1 with the above condition, ACPR of −42 dBc and efficiency of 21.5% were obtained under the conditions of the frequency of 1920 MHz and the output power of 16 dBm. This does not meet required characteristics.

Reduction in loss of the switch 105 is required to improve the efficiency of the subcircuit; however, if the value of $Z_B$ increases to be greater than 4Ω to achieve the reduction, the value of $Z_A$ also increases. As a result, the characteristics required for the main circuit are not met.

On the other hand, if the gate width of a FET used as the switch 105 is increased to reduce the loss of the switch 105, the on-resistance of the switch is 1Ω when the gate width is 2 mm. Thus, the loss at the switch 105 is 0.8 dB at a rough estimate. As a result of the evaluation of the subcircuit shown in FIG. 1 with this condition, ACPR of −42 dBc and efficiency of 23.5% are obtained when the frequency is 1920 MHz and the output power is 16 dBm. This meets the required characteristics. However, by increasing the gate width of the FET from 1 mm to 2 mm, the chip size also increases. This results in increase in the cost of the PA module.

SUMMARY OF THE INVENTION

The present invention is conceived in view of the above problems, and has an object to provide a unit to improve characteristics of the subcircuit without scarifying the characteristics of the main circuit in the PA module which switches the main circuit and the subcircuit and operates.

The radio frequency power amplifier according to an aspect of the present invention selects one path from paths according to a required output power and uses the selected path, each of the paths amplifying a signal. The radio frequency power amplifier includes: an input terminal (input terminal 121) to which a radio frequency signal is applied; a first transistor (HBT 102) which amplifies the radio frequency signal applied to the input terminal; a second transistor (HBT 103) which amplifies the radio frequency signal applied to the input terminal; a first impedance conversion circuit (matching circuit 115) connected to an output node of the second transistor; a first switch element (switch 105) connected to an output node of the first impedance conversion circuit; and a second impedance conversion circuit (output matching circuit 113) connected to an output node of the first transistor. An output node of the first switch element is connected to the output node of the first transistor via the second impedance conversion circuit, and an impedance looking into an output side of the radio frequency power amplifier from the output node of the first switch element is higher than an impedance looking into the output side of the radio frequency power amplifier from the output node of the first transistor.

Further, the radio frequency power amplifier according to an aspect of the present invention selects one path from paths according to a required output power and uses the selected path, each of the paths amplifying a signal. The radio frequency power amplifier includes: an input terminal to which a radio frequency signal is applied; a first transistor which amplifies the radio frequency signal applied to the input terminal; a second transistor which amplifies the radio frequency signal applied to the input terminal; a first impedance conversion circuit connected to an output node of the second transistor; a first switch element connected to an output node of the first impedance conversion circuit; and a second impedance conversion circuit which is connected to an output node of the first transistor and includes a harmonic suppression circuit (harmonic suppression circuit 116). An output node of the first switch element is connected to the output node of the first transistor via the harmonic suppression circuit.

Further, the harmonic suppression circuit may include: a capacitor (shunt capacitor 146) having a first end connected to the output node of the first switch element, and a second end grounded; and a first inductor element (series inductor 147) having a first end connected to the output node of the first switch element, and a second end connected to the output node of the first transistor.

Further, the radio frequency power amplifier according to an aspect of the present invention selects one path from paths according to a required output power and uses the selected path, each of the paths amplifying a signal. The radio frequency power amplifier includes: an input terminal to which a radio frequency signal is applied; a first transistor which amplifies the radio frequency signal applied to the input terminal; a second transistor which amplifies the radio frequency signal applied to the input terminal; a first impedance conversion circuit connected to an output node of the second transistor; a first switch element connected to an output node of the first impedance conversion circuit; a second inductor element (choke coil 137) connected to an output node of the first transistor; and a power terminal (collector power terminal 126) connected to the second inductor element. An output node of the first switch element is connected to the output node of the first transistor via the second inductor element.

Further, the first inductor element may be formed of a radio frequency line (spiral inductor 151) formed on a GaAs substrate.

Further, the first inductor element may be formed of a line that is formed to be continuous with a radio frequency line (microstrip 153) included in the second impedance conversion circuit.

Further, the capacitor having the second end grounded may be connected to the output node of the first switch element via a second switch element.

Further, the radio frequency power amplifier may further include a control terminal (switch control terminal 130) to which an off-signal and an on-signal are applied, the off-signal turning off the second switch element when the required output power is greater than a threshold, and the on-signal turning on the second switch element when the required output power is equal to or less than the threshold.

Further, the first inductor element may be formed of an inductor component.

The configuration according to an aspect of the present invention is applied to a PA module which selects, according to required output power, one of the main circuit including the first transistor and the subcircuit including the second transistor, the first switch, and the first impedance conversion circuit and operates. With this, characteristics of the subcircuit can be improved by the first impedance conversion circuit included in the subcircuit without scarifying the characteristics of the main circuit. Accordingly, high efficiency of the PA module under low output condition is possible.

FURTHER INFORMATION ABOUT TECHNICAL BACKGROUND TO THIS APPLICATION

The disclosure of Japanese Patent Application No. 2009-158265 filed on Jul. 2, 2009 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

Hereinafter, embodiments of a radio frequency power amplifier according to an aspect of the present invention are described with reference to the drawings.

First Embodiment

Figure 3:
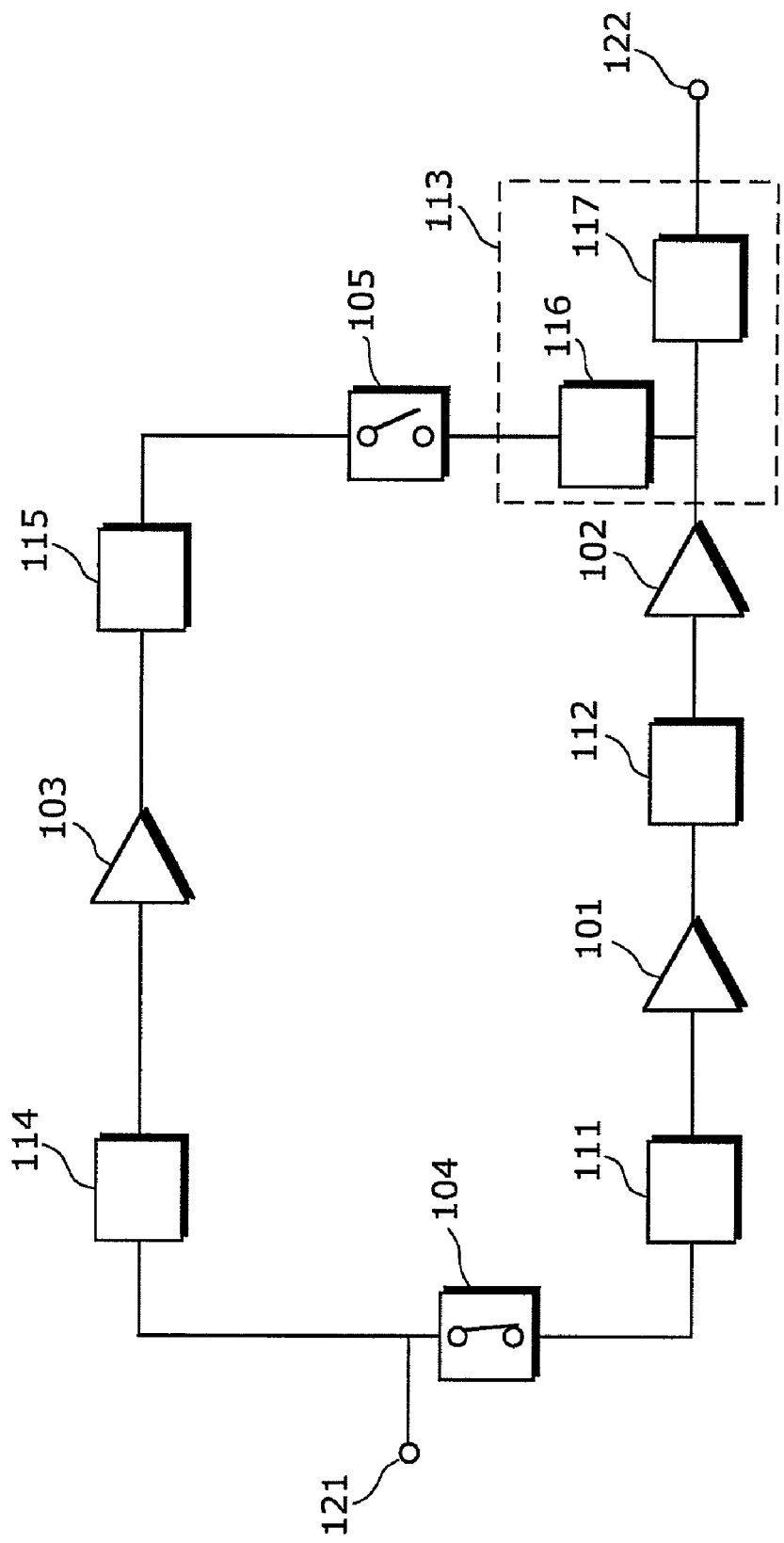
FIG. 3 is a block diagram of a PA module according to a first embodiment of the present invention.
Figure 4:
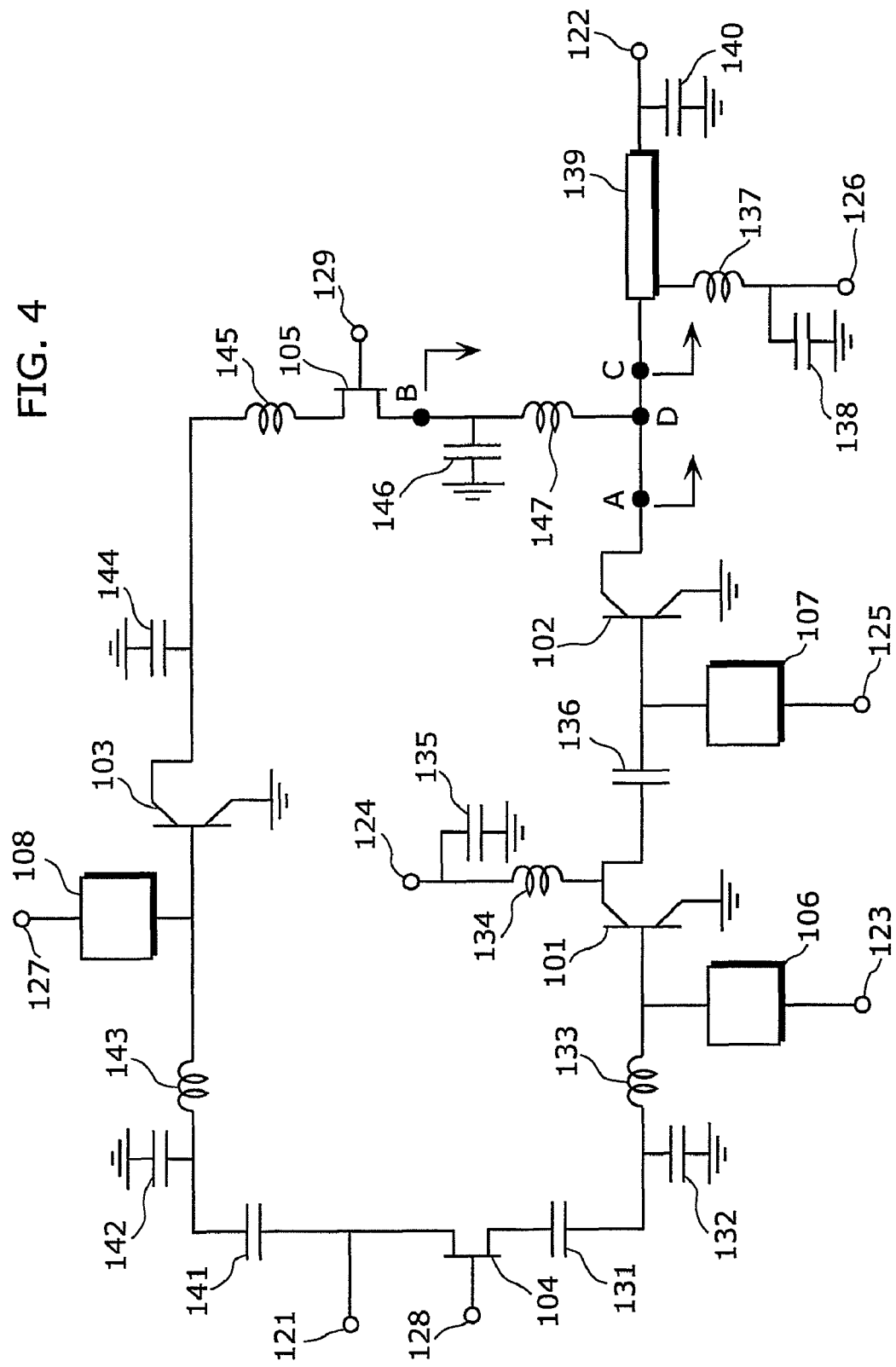
FIG. 4 is a circuit diagram of the PA module according to the first embodiment of the present invention.

FIG. 3 is a block diagram of a PA module of a radio frequency power amplifier according to a first embodiment of the present invention. FIG. 4 is a circuit diagram of the PA module.

As an example, the PA module is designed such that a main circuit operates when a radio frequency output from an output terminal 122 which is a required output power is greater than 15 dBm, and a subcircuit operates when the radio frequency output from the output terminal 122 is equal to or less than 15 dBm.

First, configuration and operations of the main circuit are described. The radio frequency power input to an input terminal 121 is input to an earlier stage HBT 101 via a switch 104 and an input matching circuit 111. The switch 104 is a single pole single throw (SPST) which uses a GaAs FET. The input matching circuit 111 includes a series capacitor 131, a shunt capacitor 132 and a series inductor 133 in the order from the input terminal 121.

The radio frequency power amplified by the earlier stage HBT 101 is input to a subsequent stage HBT 102 via an inter-stage matching circuit 112. The inter-stage matching circuit 112 includes a series capacitor 136. The radio frequency power amplified by the subsequent stage HBT 102 is output from an output terminal 122 via an output matching circuit 113. The output matching circuit 113 includes a harmonic suppression circuit 116 and a fundamental output matching circuit 117 in the order from the subsequent stage HBT 102. The harmonic suppression circuit 116 includes: a shunt capacitor 146 that has a first end connected to the output node of the switch 105 and a second end grounded; and a series inductor 147. The fundamental output matching circuit 117 includes a microstrip 139 and a shunt capacitor 140. The characteristic impedance of the microstrip 139 is designed to be 50Ω.

A collector power terminal 124 is connected to a collector of the earlier stage HBT 101 via a choke coil 134, and a collector power terminal 126 is connected to a collector of the subsequent stage HBT 102 via a choke coil 137. The choke coils 134 and 137 are provided to prevent radio frequency power from leaking to the collector power terminals 124 and 126. The collector power terminals 124 and 126 are respectively connected to first ends of grounding capacitors 135 and 138. The second ends of the grounding capacitors 135 and 138 are grounded.

A base power terminal 123 is connected to a base of the earlier stage HBT 101 via a bias circuit 106 and a base power terminal 125 is connected to a base of the subsequent stage HBT 102 via a bias circuit 107. The bias circuits 106 and 107 functions as a circuit which supplies current to the base of the earlier stage HBT 101 and the subsequent stage HBT 102, respectively.

Next, operations of the subcircuit are described. The radio frequency power input to the input terminal 121 is input to the sub HBT 103 via an input matching circuit 114. The input matching circuit 114 includes a series capacitor 141, a shunt capacitor 142 and a series inductor 143 in the order from the input terminal 121.

The radio frequency power amplified by the sub HBT 103 is output from the output terminal 122 via a matching circuit 115, a switch 105, and the output matching circuit 113. The matching circuit 115 includes a shunt capacitor 144 and a series inductor 145. An output node of the switch 105 is connected between the series inductor 147 and the shunt capacitor 146 in the harmonic suppression circuit 116.

The switch 105 is a SPST using a GaAsFET. The base width of the FET is 1 mm. Since the on-resistance per base width of 1 mm of the FET is 2 Ω/mm, the resistance of the switch 105 when the switch 105 is in its on state is 2Ω. A base power terminal 127 is connected to a base of the sub HBT 103 via a bias circuit 108.

The following table 1 shows sequence of control terminals at the time of operations of the main circuit and the subcircuit. Here, 2.8 V is applied as an on-signal to the base power terminals 123, 125, and 127, and 0 V is applied as an off-signal to the base power terminals 123, 125, and 127. On the other hand, 3.5 V is applied as an on-signal to the switch control terminals 128 and 129, and 0 V is applied as an off-signal to the switch control terminals 128 and 129.

TABLE 1

| | Terminal number | | | | |
|---|---|---|---|---|---|
| | 123 | 125 | 127 | 128 | 129 |
| At the time of operation of main circuit | ON | ON | OFF | ON | OFF |
| At the time of operation of subcircuit | OFF | OFF | ON | OFF | ON |

Figure 1:
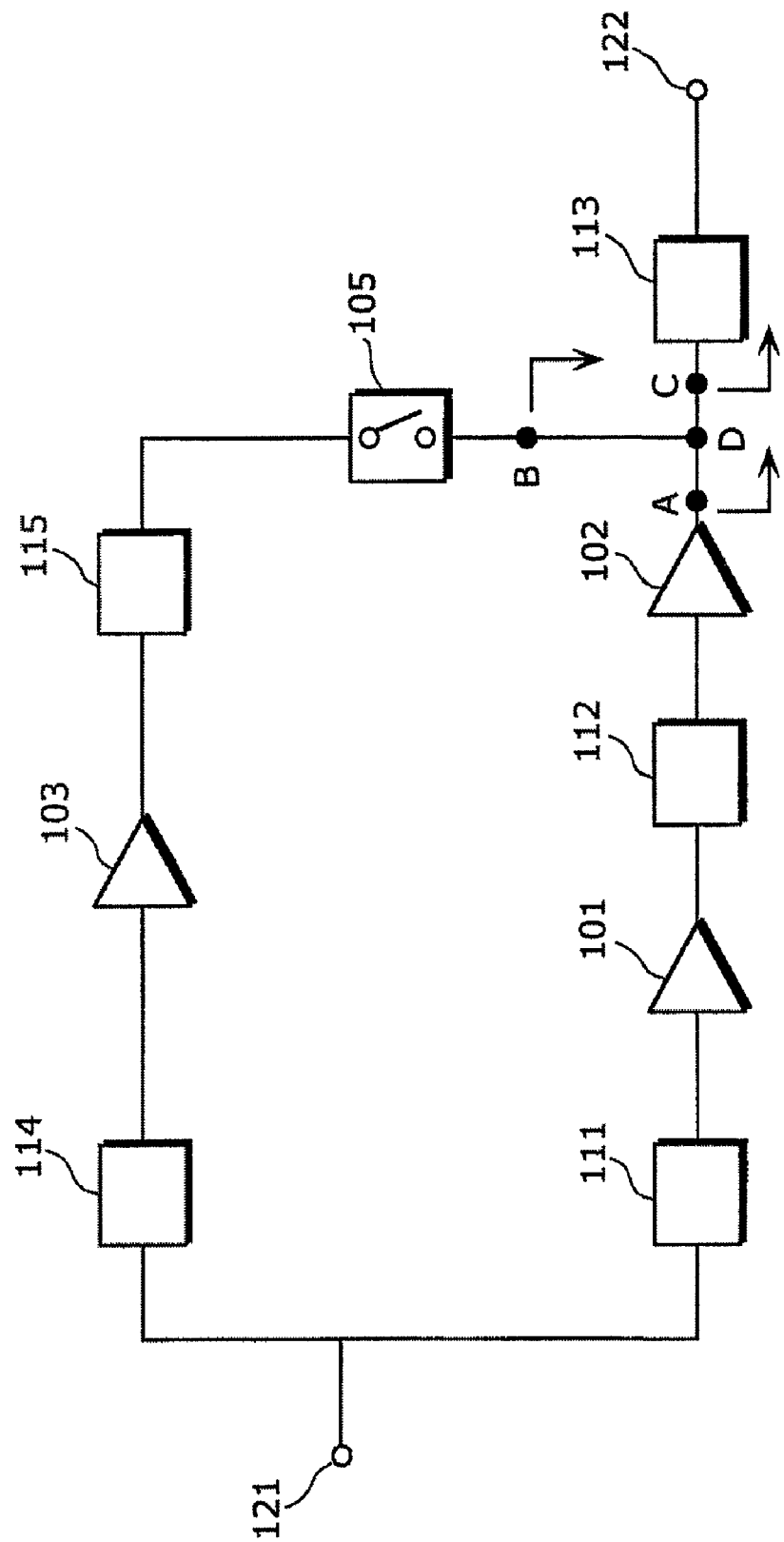
FIG. 1 is a block diagram of a conventional PA module.

The configuration shown in FIG. 4 according to the first embodiment of the present invention differs from the conventional configuration shown in FIG. 1 in that the output node of the switch 105 is connected between the series inductor 147 and the shunt capacitor 146 of the harmonic suppression circuit 116. By adjusting the size of the series inductor 147 and the shunt capacitor 146 appropriately, optimal control of $Z_B$ at the time of operation of the subcircuit is possible without changing $Z_A$ at the time of the operation of the main circuit. This allows the value of $Z_B$ to be greater than the value of $Z_A$.

Figure 2:
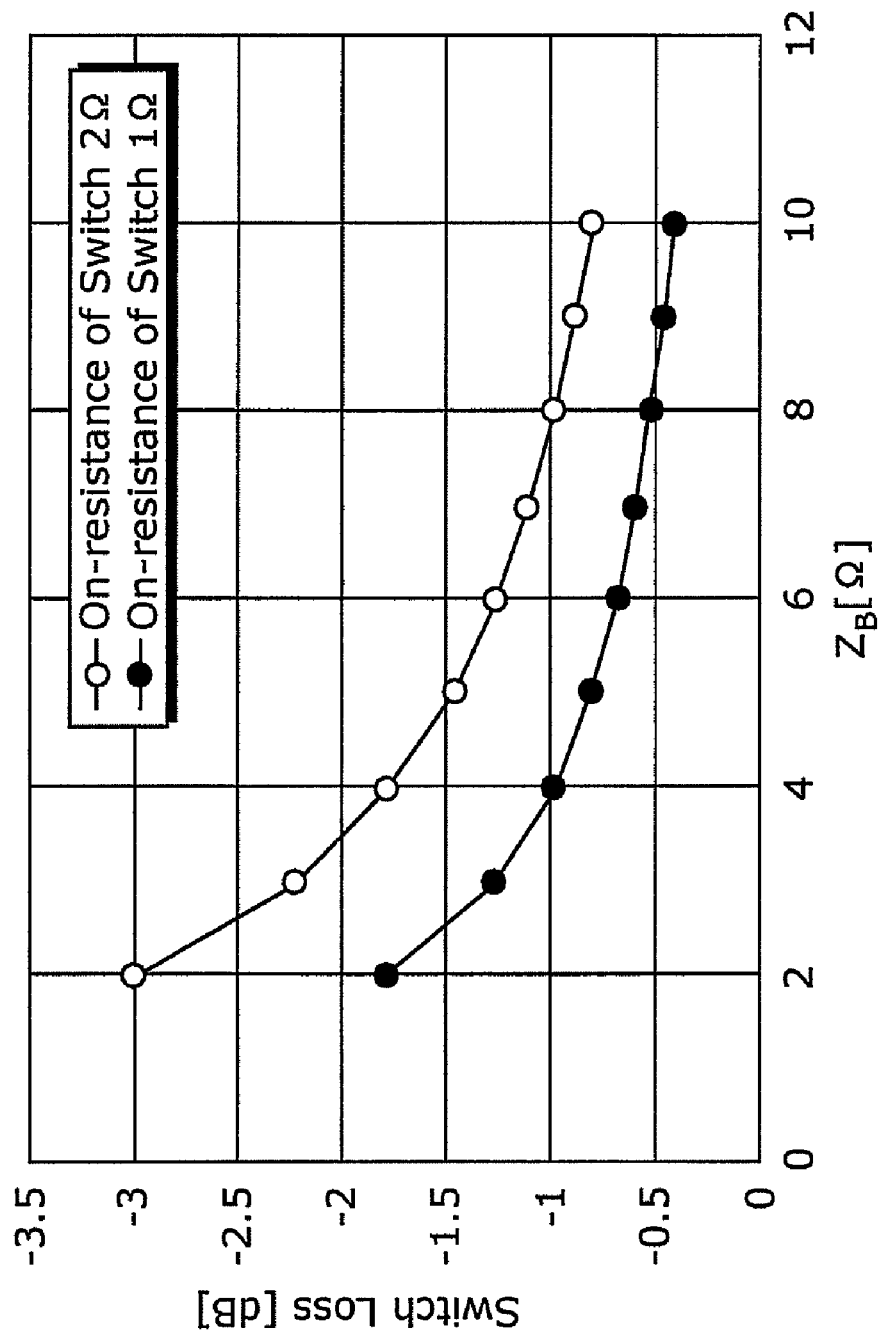
FIG. 2 is a graph showing relationship between $Z_B$ and switch loss in the conventional PA module and a PA module according to an aspect of the present invention.

FIG. 2 is a graph showing the relationship between $Z_B$ and switch loss in the PA module according to an aspect of the present invention as well as the conventional PA module. For example, where the resistance of the switch 105 is 2Ω, loss at the switch 105 is 1.75 dB when Zc is 4Ω. On the other hand, when the resistance of the switch 105 is 2Ω, it is also possible to reduce the loss to 0.8 dB by setting Zc to 10Ω. For example, in the circuit diagram of FIG. 4, $Z_B$ can be designed to be 10Ω by setting the capacitance value of the shunt capacitor 146 to 8 pF and setting the value of the series inductor 147 to 0.5 nH. As a result, required characteristics of ACPR of −42 dBc and efficiency of 23.5% are met under the conditions of frequency of 1920 MHz and the output power of 16 dBm, without scarifying the characteristics of the main circuit.

In the present embodiment, it has been described that the value of $Z_B$ is set to 10Ω. However, efficiency of the subcircuit can be improved by adjusting the values of the series inductor 147 and the shunt capacitor 146 of the harmonic suppression circuit 116 such that the value of $Z_B$ becomes greater than $Z_A$. Further, since the harmonic suppression circuit 116 is commonly used by the output matching circuit 113 and the matching circuit 115 of the subcircuit, the number of components can be reduced, which is effective for reducing size and cost.

Further, forming the series inductor 147 with chip components improves radio frequency performance, because Q factor is higher than that of an inductor formed on a GaAs substrate, and loss is low.

Second Embodiment

Figure 5:
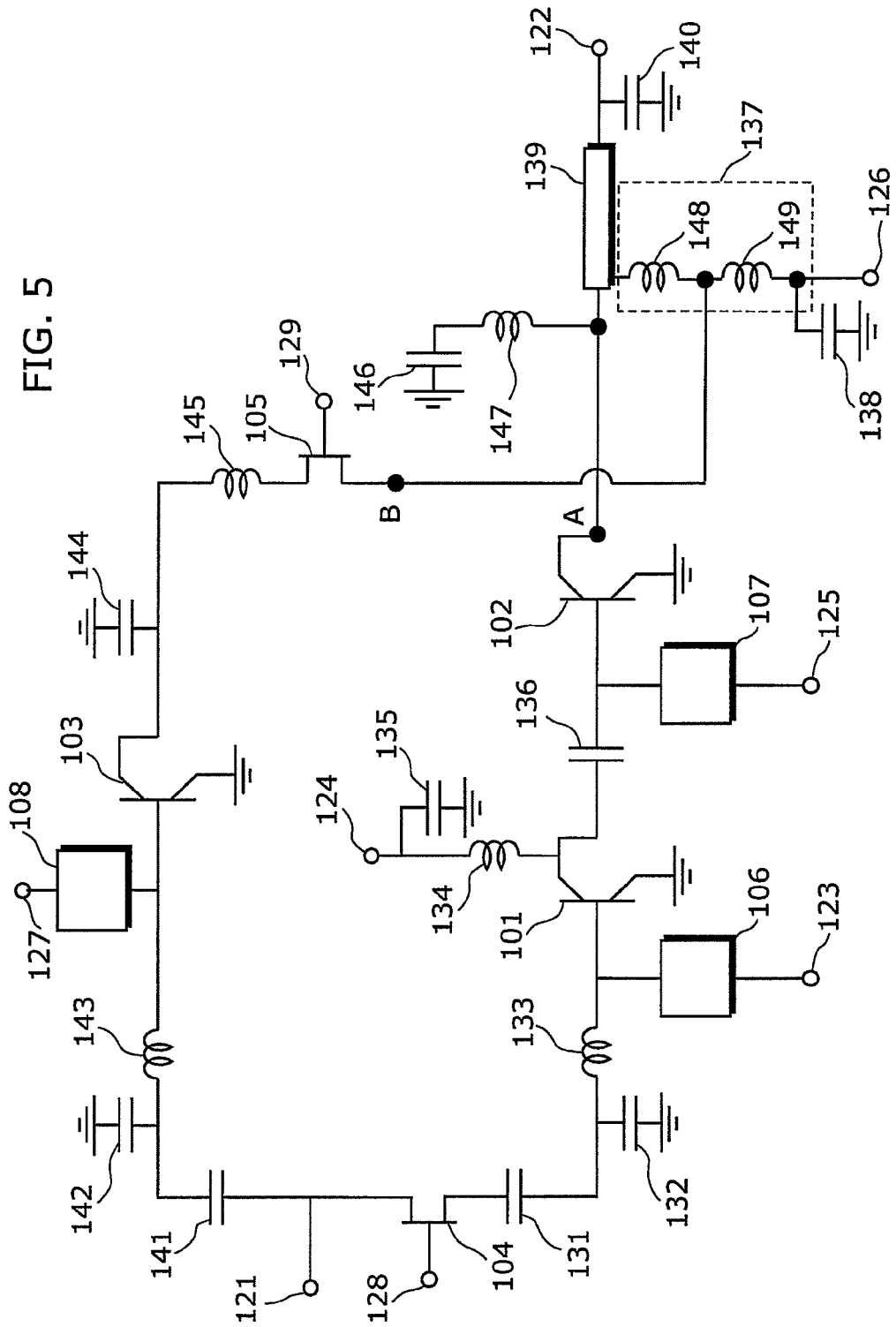
FIG. 5 is a circuit diagram of a PA module according to a second embodiment of the present invention.

FIG. 5 is a circuit diagram of a PA module according to a second embodiment of the present invention. The PA module according to the second embodiment of the present invention shown in FIG. 5 differs from the PA module according to the first embodiment shown in FIG. 4 in that the output node of the switch 105 is connected between the choke coils 148 and 149 of the collector power terminal 126. By adjusting the size of the choke coils 148 and 149 appropriately, optimal control of $Z_B$ at the time of operation of the subcircuit is possible without changing $Z_A$ at the time of the operation of the main circuit. This allows the value of $Z_B$ to be greater than the value of $Z_A$.

Here, for the conversion of impedance (Z=R+jX), changing real part (R part) is preferable; however, imaginary part (X part) may be changed.

It has been described in the second embodiment that choke coils are used; however, the same advantageous effects can be obtained even in the case where other inductors or transmission paths are used.

Third Embodiment

Figure 6:
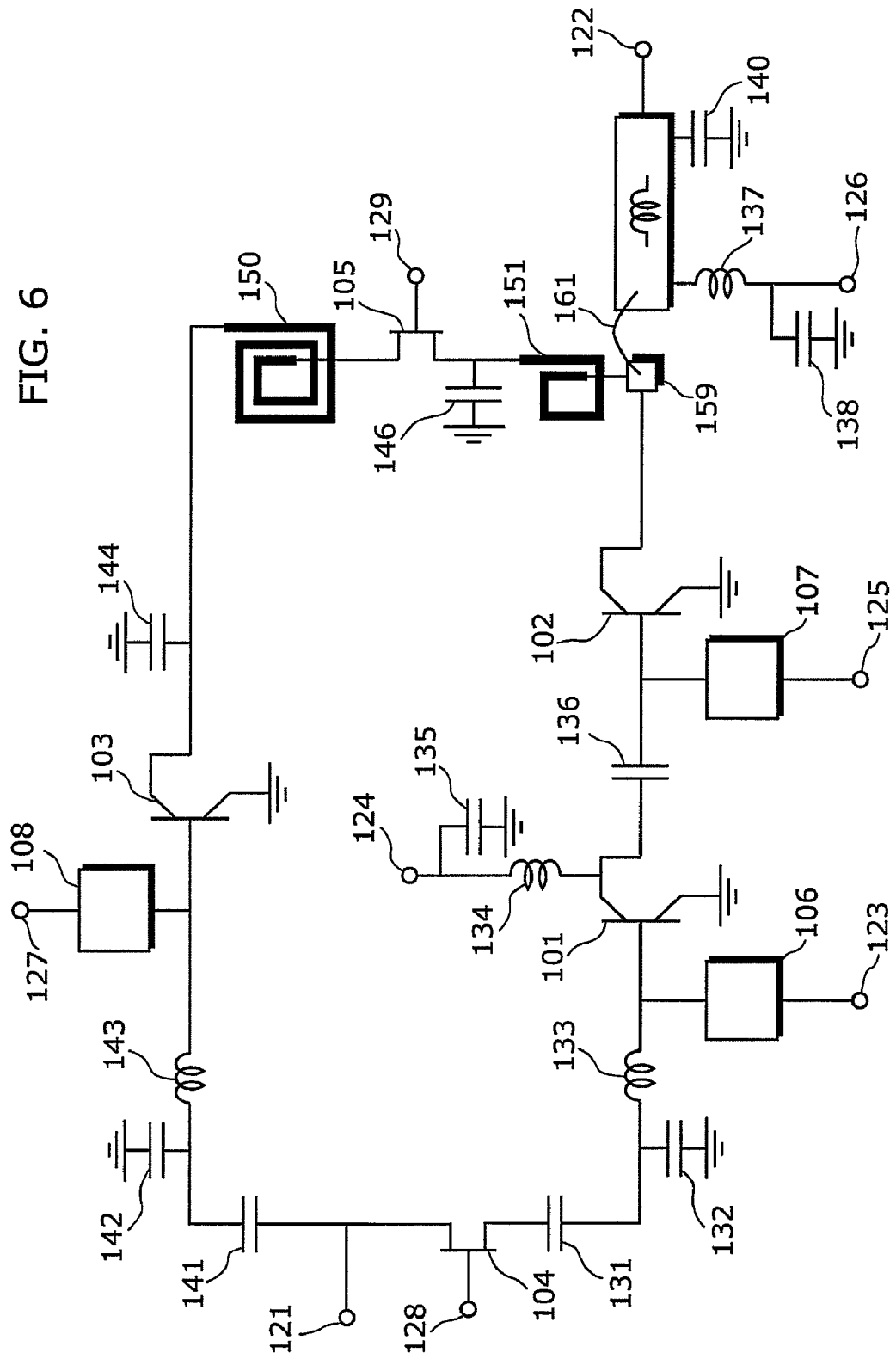
FIG. 6 is a circuit diagram of a PA module according to a third embodiment of the present invention.

FIG. 6 is a circuit diagram of a PA module according to a third embodiment of the present invention. FIG. 6 shows a specific example of configuration of the PA module shown in FIG. 4 according to the first embodiment. In FIG. 6, by using spiral inductors 150 and 151 for the series inductors 145 and 147, it is possible to form the spiral inductors 150 and 151 on the GaAs substrate on which the HBTs 101, 102, and 103, the switch 105, and the capacitors 144 and 146 are formed. A wire pad 159 on the GaAs substrate and the fundamental output matching circuit 117 are connected by a bonding wire 161.

Fourth Embodiment

Figure 7:
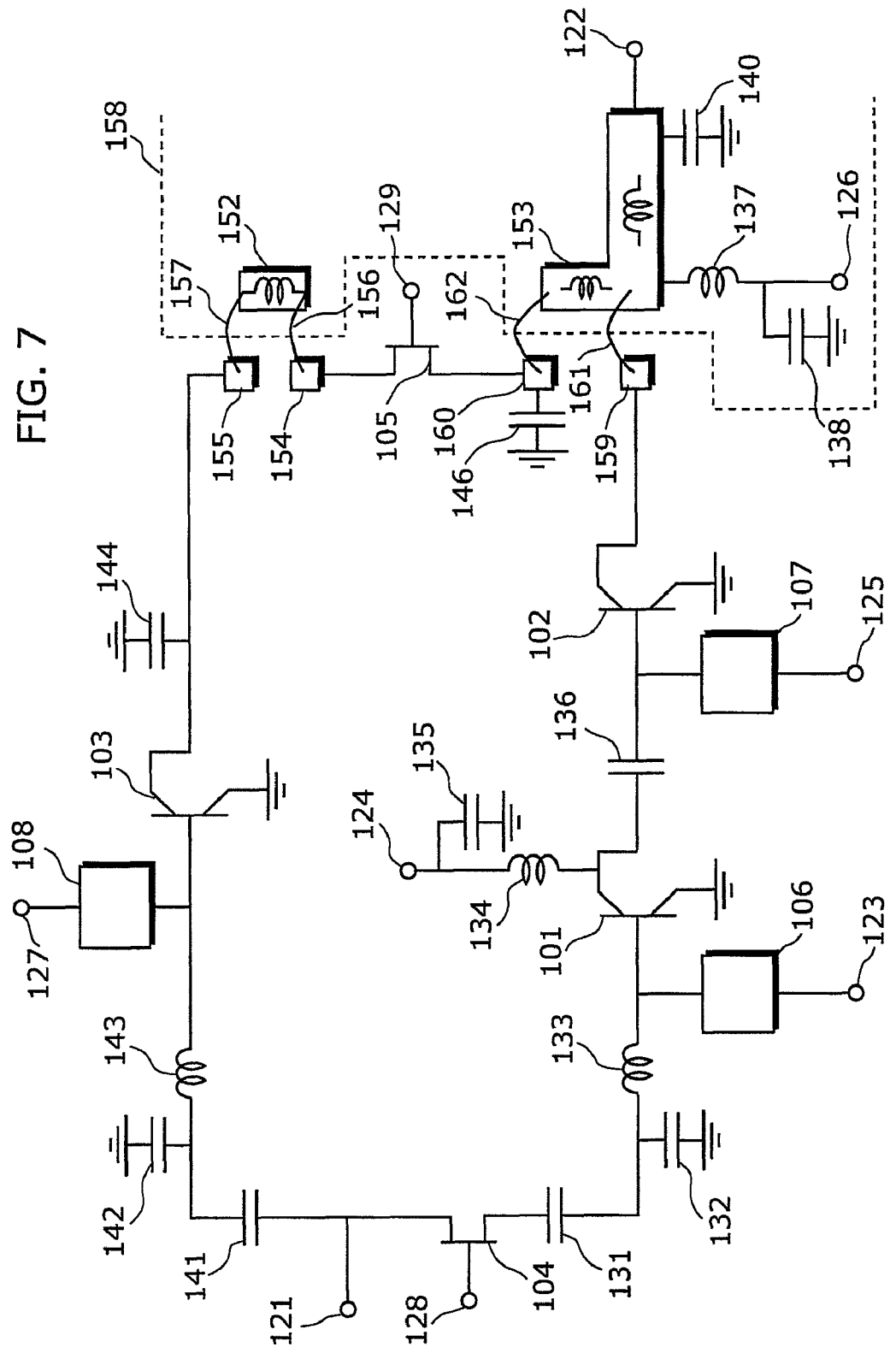
FIG. 7 is a circuit diagram of a PA module according to a fourth embodiment of the present invention.

FIG. 7 is a circuit diagram of a PA module according to fourth embodiment of the present invention. The PA module shown in FIG. 7 according to the fourth embodiment differs from the PA module shown in FIG. 6 according to the third embodiment in two points. One difference is that a chip inductor 152 is used for the spiral inductor 150 shown in FIG. 6. Second difference is that a microstrip 153 on a resin substrate 158 is used for the spiral inductor 151 shown in FIG. 6.

As to the first difference, the chip inductor 152 is provided on the resin substrate 158 and is connected to the wire pads 154 and 155 via the bonding wires 156 and 157. By forming the inductor 152 not on the GaAs substrate, but forming the inductor 152 with the chip component, the size of the GaAs substrate can be reduced, which allows reduction in cost. Further, since Q factor of the inductor that is formed of the chip component is higher than that of the inductor formed on the GaAs substrate, loss is low. Therefore, radio frequency characteristics can be improved.

As to the second difference, the microstrip 153 is used for the spiral inductor 151. The wire pads 159 and 160 on the GaAs substrate are connected to the microstrip 153 on the resin substrate 158 via the bonding wires 161 and 162. The spiral inductor 151 in FIG. 6 easily causes radio frequency loss; and thus, using the microstrip line having high Q factor for this portion improves radio frequency characteristics.

Fifth Embodiment

Figure 8:
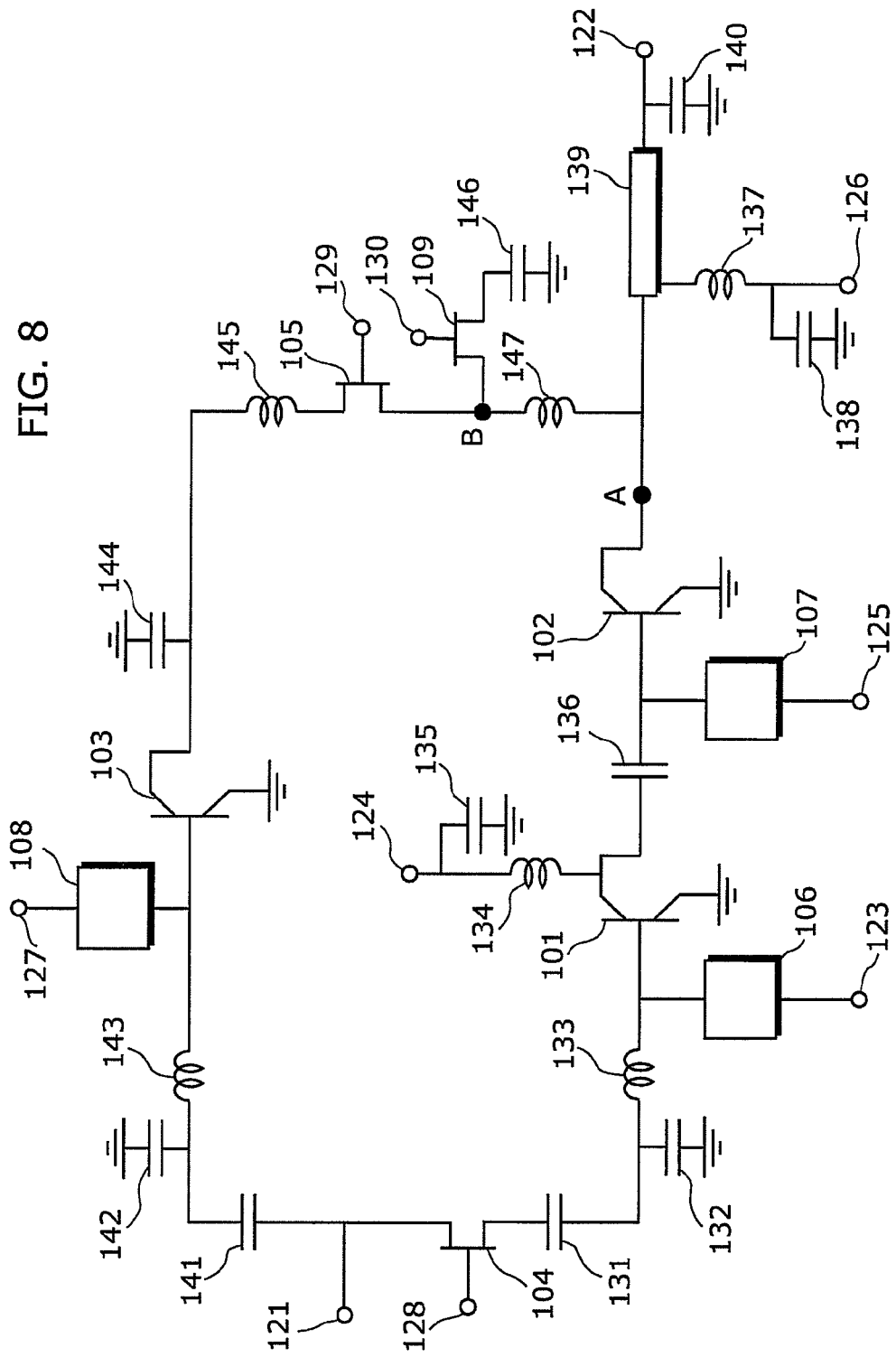
FIG. 8 is a circuit diagram of a PA module according to a fifth embodiment of the present invention.

FIG. 8 is a circuit diagram of a PA module according to fifth embodiment of the present invention. The PA module according to the fifth embodiment differs from the PA module according to the first embodiment shown in FIG. 4 in that the shunt capacitor 146 is connected via the switch 109.

In the PA module according to the first embodiment of the present invention, if the value of $Z_B$ is too high, voltage amplitude of the radio frequency output of the main circuit at the point B becomes too high; and thus, attention should be paid to this point. When the voltage amplitude exceeds the withstand voltage of the FET included in the switch 105, radio frequency power leaks to the subcircuit, and anomalous oscillation may occur due to positive feedback of sneak radio frequency power. The fifth embodiment is for solving such a problem. Table 2 indicates sequence of control terminals.

TABLE 2

| | Terminal number | | | | | |
|---|---|---|---|---|---|---|
| | 123 | 125 | 127 | 128 | 129 | 130 |
| At the time of operation of main circuit | ON | ON | OFF | ON | OFF | OFF |
| At the time of operation of subcircuit | OFF | OFF | ON | OFF | ON | ON |

As shown in Table 2, an off-signal which turns off the switch 109 is applied to the switch control terminal 130 when the main circuit operates where required output power is more than a threshold (the radio frequency output from the output terminal 122 is greater than 15 dBm), and an on-signal which turns on the switch 109 is applied to the switch control terminal 130 when the subcircuit operates where the required output power is equal to or less than the threshold (the radio frequency output from the output terminal 122 is equal to or less than 15 dBm).

More specifically, by setting the capacitance value of the shunt capacitor 146 to 8 pF, and the value of the series inductor 147 to 1.0 nH, it is possible to design $Z_B$ at the time of the operation of the subcircuit (the switch 109 is in its on state) to be 20Ω. When the main circuit operates, the switch 109 is turned off; and thus, the shunt capacitor 146 does not contribute the impedance conversion. Therefore, $Z_B$ at the time of operation of the main circuit is 4Ω+j10 Ω.

By designing $Z_B$ at the time of operation of the subcircuit to be 20Ω, loss at the switch 105 is further reduced. Even when the on-resistance of the switch 105 is 2Ω, loss is reduced to 0.4 dB. At the time of the operation of the main circuit, $Z_B$ is 4Ω+j10Ω. Even when the output of the main circuit is 28 dBm, anomalous oscillation or the like does not occur.

In the above embodiments, the case where GaAs HBT is used for the radio frequency transistor; however, other radio frequency transistors may achieve the same advantageous effects. Further, the advantageous effects can be obtained no matter how many stages the transistor has.

Further, in the above embodiments, the radio frequency power amplifier of frequency of 1920 MHz has been described; however, of course, radio frequency power amplifiers of other frequency may be applied.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The radio frequency power amplifier according to an aspect of the present invention can achieve high efficiency even in low output condition, and is a useful technique used for a transmitting device in mobile communications such as a mobile phone.

What is claimed is:

1. A radio frequency power amplifier which selects one path from paths according to a required output power and uses the selected path, each of the paths amplifying a signal, said radio frequency power amplifier comprising:
    an input terminal to which a radio frequency signal is applied;
    a first transistor, which amplifies the radio frequency signal applied to said input terminal;
    a second transistor, which amplifies the radio frequency signal applied to said input terminal;
    a first impedance conversion circuit connected to an output node of said second transistor;
    a first switch element connected to an output node of said first impedance conversion circuit;
    a second impedance conversion circuit; and
    a harmonic suppression circuit,
    wherein said output node of said first switch element is connected to said second impedance conversion circuit via said harmonic suppression circuit, and
    an output node of said first transistor is connected to said second impedance conversion circuit not via said harmonic suppression circuit.

2. The radio frequency power amplifier according to claim 1,
    wherein said harmonic suppression circuit includes:
    a capacitor having a first end connected to said output node of said first switch element, and a second end grounded, and
    a first inductor element having a first end connected to said output node of said first switch element, and a second end connected to said output node of said first transistor.

3. The radio frequency power amplifier according to claim 2,
    wherein said first inductor element is formed of a radio frequency line formed on a GaAs substrate.

4. The radio frequency power amplifier according to claim 2,
    wherein said first inductor element is formed of a line that is formed to be continuous with a radio frequency line included in said second impedance conversion circuit.

5. The radio frequency power amplifier according to claim 2,
    wherein said capacitor having said second end grounded is connected to said output node of said first switch element via a second switch element.

6. The radio frequency power amplifier according to claim 5, further comprising
    a control terminal to which an off-signal and an on-signal are applied, the off-signal turning off said second switch element when the required output power is greater than a threshold, and the on-signal turning on said second switch element when the required output power is equal to or less than the threshold.

7. The radio frequency power amplifier according to claim 2,
    wherein said first inductor element is formed of an inductor component.

8. The radio frequency power amplifier according to claim 1,
    wherein an impedance looking into an output side of said radio frequency power amplifier from said output node of said first switch element is higher than an impedance looking into the output side of said radio frequency power amplifier from said output node of said first transistor.

* * * * *